(12) United States Patent
Mulder (10) Patent No.: US 8,896,815 B2
(45) Date of Patent: Nov. 25, 2014

(54) LITHOGRAPHIC APPARATUS AND DEVICE MANUFACTURING METHOD

(71) Applicant: Heine Melle Mulder, Veldhoven (NL)

(72) Inventor: Heine Melle Mulder, Veldhoven (NL)

(73) Assignee: ASML Netherlands B.V., Veldhoven (NL)

(*) Notice: Subject to any disclaimer, the term of this patent is extended or adjusted under 35 U.S.C. 154(b) by 115 days.

(21) Appl. No.: 13/663,924

(22) Filed: Oct. 30, 2012

(65) Prior Publication Data

US 2013/0107238 A1     May 2, 2013

Related U.S. Application Data

(60) Provisional application No. 61/553,627, filed on Oct. 31, 2011.

(51) Int. Cl.
*G03F 7/26* (2006.01)
*G03F 7/20* (2006.01)

(52) U.S. Cl.
CPC .............. *G03F 7/2008* (2013.01); *G03F 7/26* (2013.01); *G03F 7/70391* (2013.01); *G03F 7/70575* (2013.01); *G03F 7/704* (2013.01)
USPC ................................ 355/67; 355/46; 355/77

(58) Field of Classification Search
CPC . G03F 7/7005; G03F 7/7015; G03F 7/70191; G03F 7/70208; G03F 7/70308; G03F 7/70316; G03F 7/70366; G03F 7/70383; G03F 7/70391; G03F 7/26; G03F 7/2008; G03F 7/70275; G03F 7/704; G03F 7/70575
USPC .................... 355/46, 67, 71, 77; 359/298, 615
See application file for complete search history.

(56) References Cited

U.S. PATENT DOCUMENTS

| 4,090,206 A | 5/1978 | Pfeifer |
| 4,447,126 A | 5/1984 | Heidrich |
| 4,520,472 A | 5/1985 | Reno |

(Continued)

FOREIGN PATENT DOCUMENTS

| DE | 4315580 | 11/1994 |
| DE | 4315581 | 11/1994 |

(Continued)

OTHER PUBLICATIONS

Japanese Office Action mailed Jan. 7, 2014 in corresponding Japanese Patent Application No. 2012-238555.

(Continued)

*Primary Examiner* — Colin Kreutzer
(74) *Attorney, Agent, or Firm* — Pillsbury Winthrop Shaw Pittman LLP (57) ABSTRACT

A apparatus having a projection system to project a plurality of radiation beams onto a substrate, wherein the plurality of radiation beams includes a first group of one or more radiation beams formed from radiation within a first wavelength range and a second group of one or more radiation beams formed from radiation within a second wavelength range, different from the first wavelength range. The apparatus also has a dispersion element configured such that one or more radiation beams of the first group are incident on the dispersion element at a different angle from the one or more radiation beams of the second group and such that the one or more radiation beams of the first and second group output from the dispersion element are substantially parallel.

20 Claims, 7 Drawing Sheets

(56) References Cited

U.S. PATENT DOCUMENTS

| | | | |
|---|---|---|---|
| 4,525,729 A | 6/1985 | Agulnek |
| 4,640,573 A | 2/1987 | Kataoka |
| 4,780,730 A | 10/1988 | Dodge |
| 4,796,038 A | 1/1989 | Allen |
| 4,844,568 A | 7/1989 | Suzuki |
| 4,864,216 A | 9/1989 | Kalata |
| 4,952,949 A | 8/1990 | Uebbing |
| 5,051,762 A | 9/1991 | Lea |
| 5,083,023 A | 1/1992 | Miyagawa |
| 5,216,247 A | 6/1993 | Wang |
| 5,216,534 A | 6/1993 | Boardman |
| 5,229,872 A | 7/1993 | Mumola |
| 5,296,891 A | 3/1994 | Vogt |
| 5,457,488 A | 10/1995 | Nakamura |
| 5,481,392 A | 1/1996 | Damer |
| 5,523,193 A | 6/1996 | Nelson |
| 5,568,320 A | 10/1996 | Rees |
| 5,589,973 A | 12/1996 | King |
| 5,610,754 A | 3/1997 | Gheen |
| 5,668,587 A | 9/1997 | Hammond |
| 5,705,788 A | 1/1998 | Beyer |
| 5,838,024 A | 11/1998 | Masuda |
| 5,840,451 A | 11/1998 | Moore |
| 6,037,965 A | 3/2000 | Gross |
| 6,072,516 A | 6/2000 | Yamakawa |
| 6,133,986 A | 10/2000 | Johnson |
| 6,204,875 B1 | 3/2001 | De Loor |
| 6,268,613 B1 | 7/2001 | Cantu |
| 6,310,710 B1 | 10/2001 | Shahar |
| 6,313,862 B1 | 11/2001 | Berner |
| 6,466,352 B1 | 10/2002 | Shahar |
| 6,531,681 B1 | 3/2003 | Markle |
| 6,559,438 B1 | 5/2003 | Drobot |
| 6,683,727 B1 | 1/2004 | Goring |
| 6,765,647 B1 | 7/2004 | Nishi |
| 6,795,169 B2 | 9/2004 | Tanaka |
| 6,967,711 B2 | 11/2005 | Gui |
| 7,116,402 B2 | 10/2006 | Gui |
| 7,969,636 B2 | 6/2011 | Naito |
| 2001/0028461 A1 | 10/2001 | Hill et al. |
| 2002/0115021 A1 | 8/2002 | Piao |
| 2002/0126479 A1 | 9/2002 | Zhai |
| 2002/0171047 A1 | 11/2002 | Chan |
| 2003/0043582 A1 | 3/2003 | Chan |
| 2003/0091277 A1 | 5/2003 | Mei |
| 2004/0124372 A1 | 7/2004 | Gil |
| 2004/0135159 A1 | 7/2004 | Siegel |
| 2004/0257629 A1 | 12/2004 | Noehte |
| 2005/0167508 A1 | 8/2005 | Syms |
| 2005/0219496 A1* | 10/2005 | Oshida et al. ............... 355/67 |
| 2006/0001855 A1 | 1/2006 | Lof |
| 2006/0103719 A1 | 5/2006 | Katzir |
| 2006/0108508 A1 | 5/2006 | Khalid |
| 2006/0291862 A1* | 12/2006 | Kawai ............... 398/79 |
| 2007/0034890 A1 | 2/2007 | Daschner |
| 2007/0182808 A1 | 8/2007 | Stiblert |
| 2007/0296936 A1 | 12/2007 | Kato |
| 2008/0042969 A1 | 2/2008 | Baker |
| 2008/0047445 A1 | 2/2008 | Berner |
| 2008/0137051 A1 | 6/2008 | Maly |
| 2008/0160211 A1 | 7/2008 | Siegel |
| 2008/0210888 A1 | 9/2008 | Inoue |
| 2009/0296063 A1 | 12/2009 | Opower |
| 2010/0142757 A1 | 6/2010 | Sandstrom |
| 2010/0265557 A1 | 10/2010 | Sallander |
| 2010/0283978 A1* | 11/2010 | Hawryluk ............... 355/18 |
| 2010/0302514 A1 | 12/2010 | Silverstein et al. |
| 2011/0051211 A1 | 3/2011 | Walther |
| 2011/0188016 A1 | 8/2011 | De Jager |

FOREIGN PATENT DOCUMENTS

| | | |
|---|---|---|
| DE | 19813127 | 10/1998 |
| EP | 1 835 347 | 9/2007 |
| JP | 57-152273 | 9/1982 |
| JP | 06-275936 | 9/1994 |
| JP | H09-260249 | 10/1997 |
| JP | 2003-220484 | 8/2003 |
| JP | 2009-301066 | 12/2009 |
| WO | 97/34171 | 9/1997 |
| WO | 98/33096 | 7/1998 |
| WO | 98/38597 | 9/1998 |
| WO | 2005/006082 | 1/2005 |
| WO | 2005/085947 | 9/2005 |
| WO | 2006/002668 | 1/2006 |
| WO | 2006/064363 | 6/2006 |
| WO | 2007/050022 | 5/2007 |
| WO | 2007/050023 | 5/2007 |
| WO | 2007/098935 | 9/2007 |
| WO | 2008/071347 | 6/2008 |
| WO | 2010/032224 | 3/2010 |
| WO | 2010/151123 | 12/2010 |
| WO | 2011/026610 | 3/2011 |
| WO | 2011/104175 | 9/2011 |

OTHER PUBLICATIONS

International Search Report mailed Jun. 14, 2011 in International Search No. PCT/EP2011/052408.

LOT-Oriel Group Europe, "MicroWriter™ Laser Lithography System," www.LOT-Oriel.com (2 pp, date unknown, obtained Jul. 2010).

"Large-Plate Exposure System FX-63S," Nikon Web Magazine: Nikon Technology Outlook, Sep. 24, 2004, pp. 1-4.

JetScreen DX Flat Brochure (6 pp., date unknown, obtained Feb. 2009).

"Lithographic Apparatus and Device Manufacturing Method," Research Disclosure, Mason Publications, Hampshire, GB, vol. 551, No. 29, Mar. 1, 2010, p. 322, XP007139689, ISSN: 0374-4353.

* cited by examiner

LITHOGRAPHIC APPARATUS AND DEVICE MANUFACTURING METHOD

This application claims priority and benefit under 35 U.S.C. §119(e) to U.S. Provisional Patent Application No. 61/553,627, filed on Oct. 31, 2011. The content of that application is incorporated herein in its entirety by reference.

FIELD

The present invention relates to a lithographic apparatus and a method for manufacturing a device.

BACKGROUND

A lithographic apparatus is a machine that applies a desired pattern onto a substrate or part of a substrate. A lithographic apparatus may be used, for example, in the manufacture of integrated circuits (ICs), flat panel displays and other devices or structures having fine features. In a conventional lithographic apparatus, a patterning device, which may be referred to as a mask or a reticle, may be used to generate a circuit pattern corresponding to an individual layer of the IC, flat panel display, or other device). This pattern may transferred on (part of) the substrate (e.g. silicon wafer or a glass plate), e.g. via imaging onto a layer of radiation-sensitive material (resist) provided on the substrate.

Instead of a circuit pattern, the patterning device may be used to generate other patterns, for example a color filter pattern, or a matrix of dots. Instead of a conventional mask, the patterning device may comprise a patterning array that comprises an array of individually controllable elements that generate the circuit or other applicable pattern. An advantage of such a "maskless" system compared to a conventional mask-based system is that the pattern can be provided and/or changed more quickly and for less cost.

Thus, a maskless system includes a programmable patterning device (e.g., a spatial light modulator, a contrast device, etc.). The programmable patterning device is programmed (e.g., electronically or optically) to form the desired patterned beam using the array of individually controllable elements. Types of programmable patterning devices include micromirror arrays, liquid crystal display (LCD) arrays, grating light valve arrays, arrays of self-emissive contrast devices and the like. A programmable patterning device could also be formed from an electro-optical deflector, configured for example to move spots of radiation projected onto the substrate or to intermittently direct a radiation beam away from the substrate, for example to a radiation beam absorber. In either such arrangement, the radiation beam may be continuous.

SUMMARY

In a lithographic process, a plurality of radiation beams may be created, patterned and projected onto a substrate. In one example, arrays of self-emissive contrast devices may be used in order to generate the radiation beams, as identified above. However, although each of the self-emissive contrast devices may be designed to provide a radiation beam at a nominal wavelength, there will likely be some variation in the wavelength of the radiation beam provided by each of the self-emissive contrast devices. This may result, for example, from manufacturing tolerances and/or environmental factors affecting the performance of the self-emissive contrast device in use. The self-emissive contrast devices may, for example, be laser diodes. In the case of presently available laser diodes having a nominal wavelength of 405 nm, the wavelengths of the beam of radiation provided by respective laser diodes typically falls within a range of 400 to 410 nm.

Variation of the wavelength of the beams of radiation projected onto the substrate is undesirable. In particular, as each radiation beam passes through various optical elements within the projection system used to project the radiation beams onto the substrate, the response of each radiation beam may be dependent upon its specific wavelength. Consequently, there may be deviation from a nominal grid of spots of radiation that are projected onto the substrate derived from the plurality of radiation beams. This could result in an error in the pattern being formed, which is undesirable.

It is therefore desirable, for example, to provide a lithographic system in which one or more problems introduced by deviation of the wavelength of one or more of the radiation beams from a nominal value can be mitigated or minimized.

According to an embodiment of the invention, there is provided a lithographic apparatus, comprising:
 a projection system configured to project a plurality of radiation beams onto a substrate, wherein the plurality of radiation beams comprises a first group of one or more radiation beams formed from radiation within a first wavelength range and a second group of one or more radiation beams formed from radiation within a second wavelength range, different from the first wavelength range; and
 a dispersion element, configured such that one or more radiation beams of the first group are incident on the dispersion element at a different angle from the one or more radiation beams of the second group and such that the one or more radiation beams of the first and second group output from the dispersion element are substantially parallel.

According to an embodiment of the invention, there is provided a device manufacturing method comprising:
 using a projection system to project a plurality of radiation beams onto a substrate, wherein the plurality of radiation beams comprises a first group of one or more radiation beams formed from radiation within a first wavelength range and a second group of one or more radiation beams formed from radiation within a second wavelength range, different from the first wavelength range; and
 passing the radiation beams via a dispersion element such that the one or more radiation beams of the first group are incident on the dispersion element at a different angle from the one or more radiation beams of the second group and such that the radiation beams of the first and second group output from the dispersion element are substantially parallel.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

An embodiment of the present invention relates to a lithographic apparatus that may include a programmable patterning device that may, for example, be comprised of an array of self-emissive constrast devices. Further description regarding such a lithographic apparatus is found in PCT patent application publication no. WO 2010/032224 A2 and U.S. patent application publication No. US 2011-0188016, which are hereby incorporated by reference in their entirety. However, an embodiment of the present invention may be used with any form of programmable patterning device including, for example, those discussed above.

Figure 1:
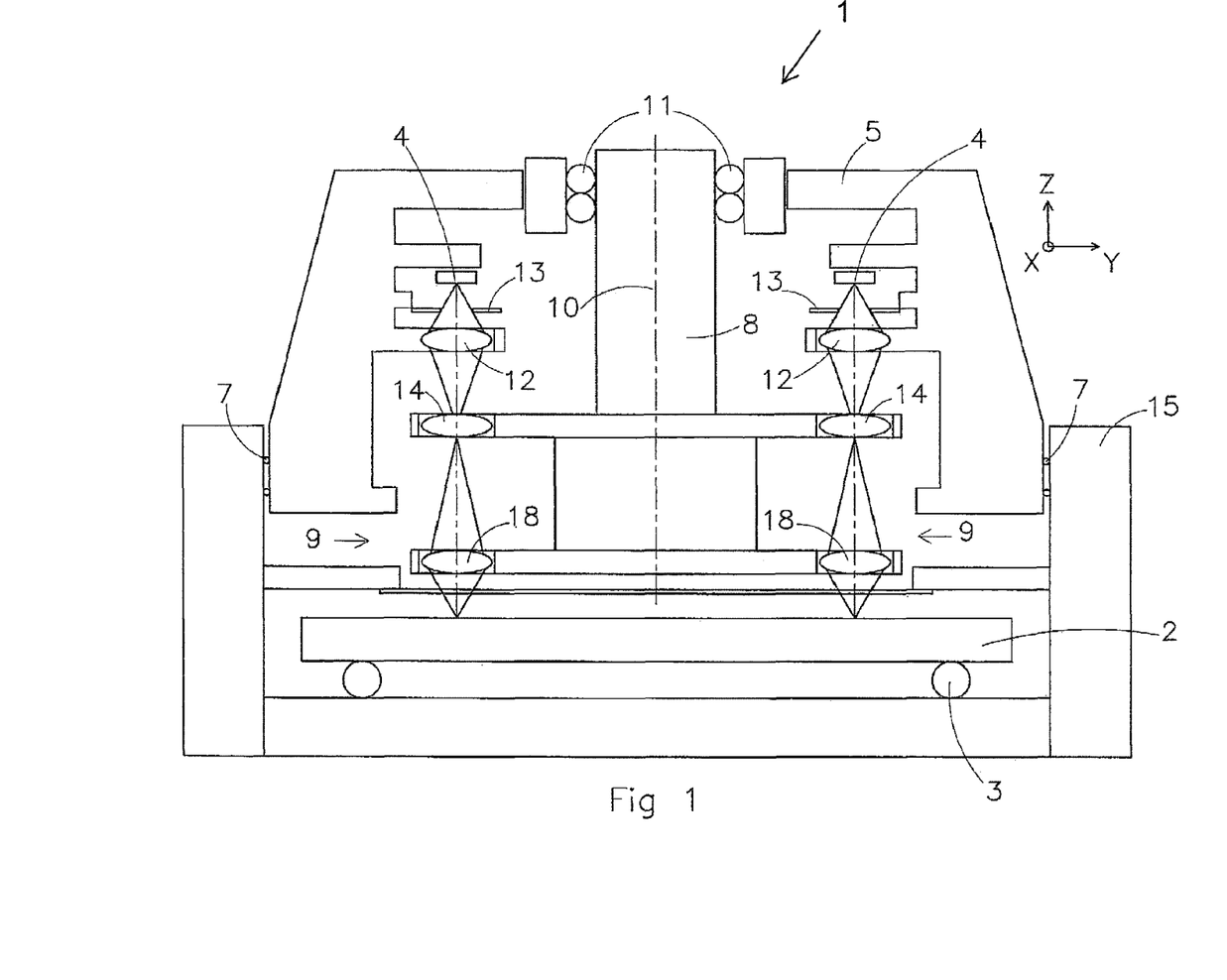
FIG. 1 depicts a part of a lithographic apparatus according to an embodiment of the invention.

FIG. 1 schematically depicts a schematic cross-sectional side view of a part of a lithographic apparatus. In this embodiment, the lithographic apparatus has individually controllable elements substantially stationary in the X-Y plane as discussed further below although it need not be the case. The lithographic apparatus 1 comprises a substrate table 2 to hold a substrate, and a positioning device 3 to move the substrate table 2 in up to 6 degrees of freedom. The substrate may be a resist-coated substrate. In an embodiment, the substrate is a wafer. In an embodiment, the substrate is a polygonal (e.g. rectangular) substrate. In an embodiment, the substrate is a glass plate. In an embodiment, the substrate is a plastic substrate. In an embodiment, the substrate is a foil. In an embodiment, the lithographic apparatus is suitable for roll-to-roll manufacturing.

The lithographic apparatus 1 further comprises a plurality of individually controllable self-emissive contrast devices 4 configured to emit a plurality of beams. In an embodiment, the self-emissive contrast device 4 is a radiation emitting diode, such as a light emitting diode (LED), an organic LED (OLED), a polymer LED (PLED), or a laser diode (e.g., a solid state laser diode). In an embodiment, each of the individually controllable elements 4 is a blue-violet laser diode (e.g., Sanyo model no. DL-3146-151). Such diodes may be supplied by companies such as Sanyo, Nichia, Osram, and Nitride. In an embodiment, the diode emits UV radiation, e.g., having a wavelength of about 365 nm or about 405 nm. In an embodiment, the diode can provide an output power selected from the range of 0.5-200 mW. In an embodiment, the size of laser diode (naked die) is selected from the range of 100-800 micrometers. In an embodiment, the laser diode has an emission area selected from the range of 0.5-5 micrometers$^2$. In an embodiment, the laser diode has a divergence angle selected from the range of 5-44 degrees. In an embodiment, the diodes have a configuration (e.g., emission area, divergence angle, output power, etc.) to provide a total brightness more than or equal to about $6.4 \times 10^8$ W/(m$^2$·sr).

Figure 2:
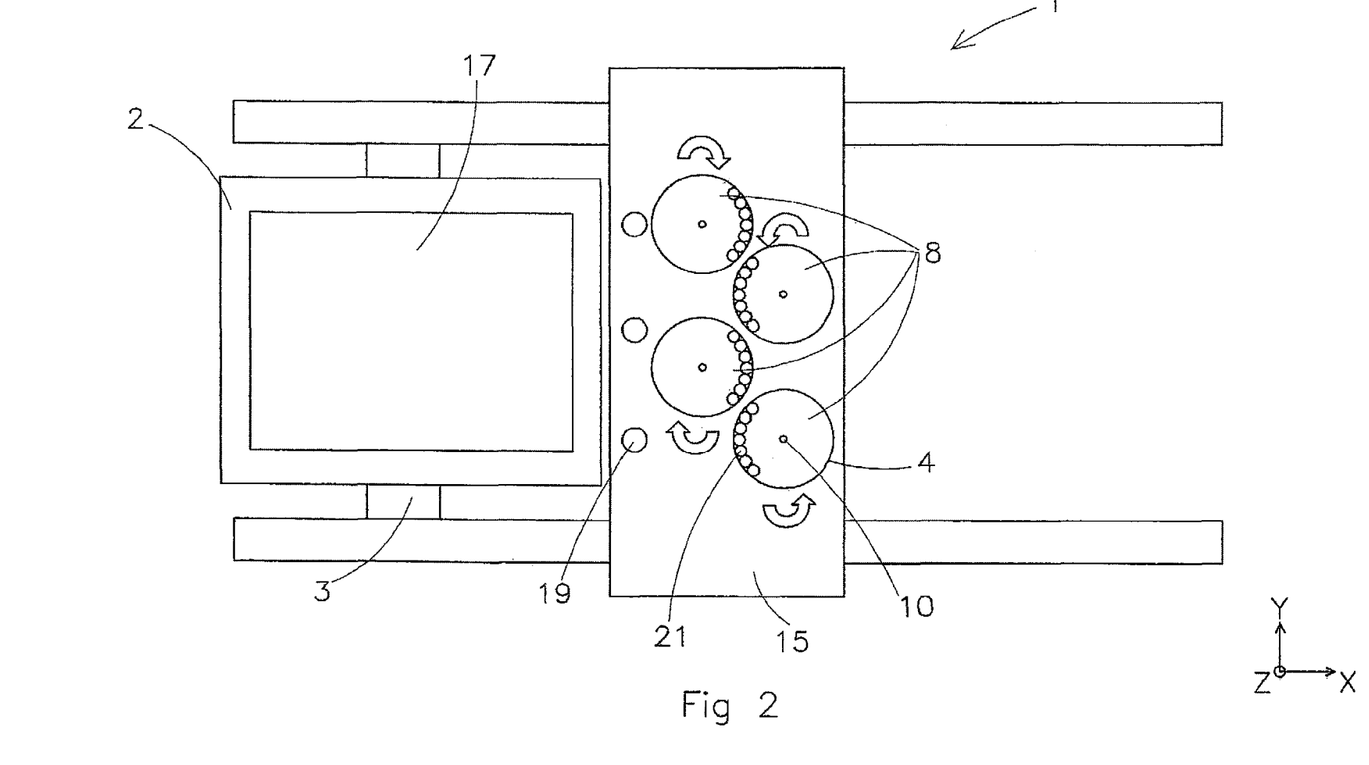
FIG. 2 depicts a top view of a part of the lithographic apparatus of FIG. 1 according to an embodiment of the invention.

The self-emissive contrast devices 4 are arranged on a frame 5 and may extend along the Y-direction and/or the X direction. While one frame 5 is shown, the lithographic apparatus may have a plurality of frames 5 as shown in FIG. 2. Further arranged on the frame 5 is lens 12. Frame 5 and thus self-emissive contrast device 4 and lens 12 are substantially stationary in the X-Y plane. Frame 5, self-emissive contrast device 4 and lens 12 may be moved in the Z-direction by actuator 7. Alternatively or additionally, lens 12 may be moved in the Z-direction by an actuator related to this particular lens. Optionally, each lens 12 may be provided with an actuator.

The self-emissive contrast device 4 may be configured to emit a beam and the projection system 12, 14 and 18 may be configured to project the beam onto a target portion of the substrate. The self-emissive contrast device 4 and the projection system form an optical column. The lithographic apparatus 1 may comprise an actuator (e.g. motor 11) to move the optical column or a part thereof with respect to the substrate. Frame 8 with arranged thereon field lens 14 and imaging lens 18 may be rotatable with the actuator. A combination of field lens 14 and imaging lens 18 forms movable optics 9. In use, the frame 8 rotates about its own axis 10, for example, in the directions shown by the arrows in FIG. 2. The frame 8 is rotated about the axis 10 using an actuator e.g. motor 11. Further, the frame 8 may be moved in a Z direction by motor 7 so that the movable optics 9 may be displaced relative to the substrate table 2.

An aperture structure 13 having an aperture therein may be located above lens 12 between the lens 12 and the self-emissive contrast device 4. The aperture structure 13 can limit diffraction effects of the lens 12, the associated self-emissive contrast device 4, and/or of an adjacent lens 12/self-emissive contrast device 4.

The depicted apparatus may be used by rotating the frame 8 and simultaneously moving the substrate on the substrate table 2 underneath the optical column. The self-emissive contrast device 4 can emit a beam through the lenses 12, 14, and 18 when the lenses are substantially aligned with each other. By moving the lenses 14 and 18, the image of the beam on the substrate is scanned over a portion of the substrate. By simultaneously moving the substrate on the substrate table 2 underneath the optical column, the portion of the substrate which is subjected to an image of the self-emissive contrast device 4 is also moving. By switching the self-emissive contrast device 4 "on" and "off" (e.g., having no output or output below a threshold when it is "off" and having an output above a threshold when it is "on") at high speed under control of a controller, controlling the rotation of the optical column or part thereof, controlling the intensity of the self-emissive contrast device 4, and controlling the speed of the substrate, a desired pattern can be imaged in the resist layer on the substrate.

FIG. 2 depicts a schematic top view of the lithographic apparatus of FIG. 1 having self-emissive contrast devices 4. Like the lithographic apparatus 1 shown in FIG. 1, the lithographic apparatus 1 comprises a substrate table 2 to hold a substrate 17, a positioning device 3 to move the substrate table 2 in up to 6 degrees of freedom, an alignment/level sensor 19 to determine alignment between the self-emissive contrast device 4 and the substrate 17, and to determine whether the substrate 17 is at level with respect to the projection of the self-emissive contrast device 4. As depicted the substrate 17 has a rectangular shape, however also or alternatively round substrates may be processed.

The self-emissive contrast device 4 is arranged on a frame 15. The self-emissive contrast device 4 may be a radiation emitting diode, e.g., a laser diode, for instance a blue-violet laser diode. As shown in FIG. 2, the self-emissive contrast devices 4 may be arranged into an array 21 extending in the X-Y plane.

The array 21 may be an elongate line. In an embodiment, the array 21 may be a single dimensional array of self-emissive contrast devices 4. In an embodiment, the array 21 may be a two dimensional array of self-emissive contrast device 4.

A rotating frame 8 may be provided which may be rotating in a direction depicted by the arrow. The rotating frame may be provided with lenses 14, 18 (show in FIG. 1) to provide an image of each of the self-emissive contrast devices 4. The apparatus may be provided with an actuator to rotate the optical column comprising the frame 8 and the lenses 14, 18 with respect to the substrate.

Figure 3:
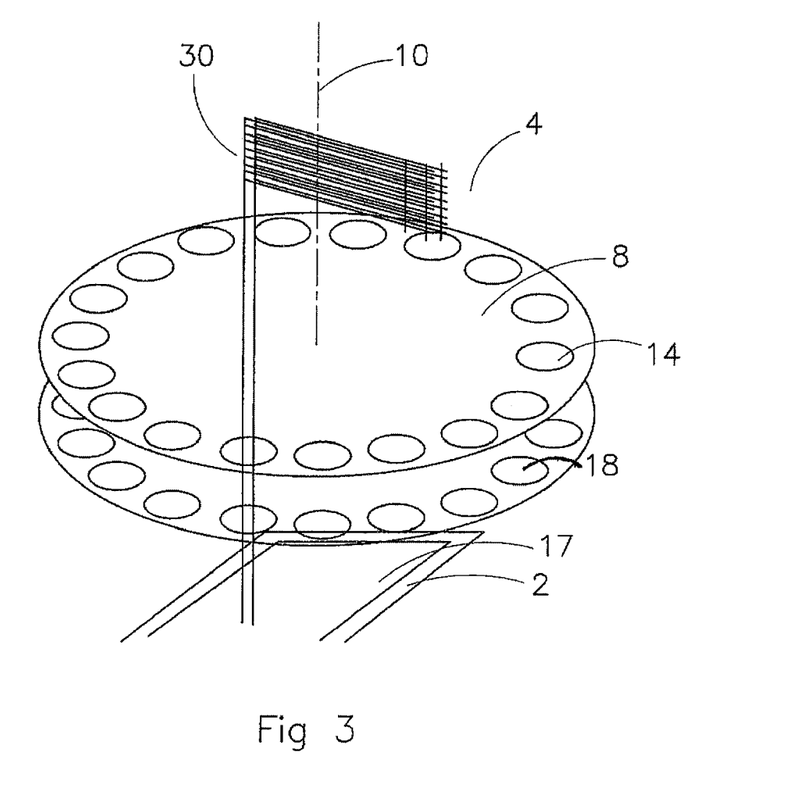
FIG. 3 depicts a highly schematic, perspective view of a part of a lithographic apparatus according to an embodiment of the invention.

FIG. 3 depicts a highly schematic, perspective view of the rotating frame 8 provided with lenses 14, 18 at its perimeter. A plurality of beams, in this example 10 beams, are incident onto one of the lenses and projected onto a target portion of the substrate 17 held by the substrate table 2. In an embodiment, the plurality of beams are arranged in a straight line. The rotatable frame is rotatable about axis 10 by means of an actuator (not shown). As a result of the rotation of the rotatable frame 8, the beams will be incident on successive lenses 14, 18 (field lens 14 and imaging lens 18) and will, incident on each successive lens, be deflected thereby so as to travel along a part of the surface of the substrate 17, as will be explained in more detail with reference to FIG. 4. In an embodiment, each beam is generated by a respective source, i.e. a self-emissive contrast device, e.g. a laser diode (not shown in FIG. 3). In the arrangement depicted in FIG. 3, the beams are deflected and brought together by a segmented mirror 30 in order to reduce a distance between the beams, to thereby enable a larger number of beams to be projected through the same lens and to achieve resolution requirements to be discussed below.

Figure 4:
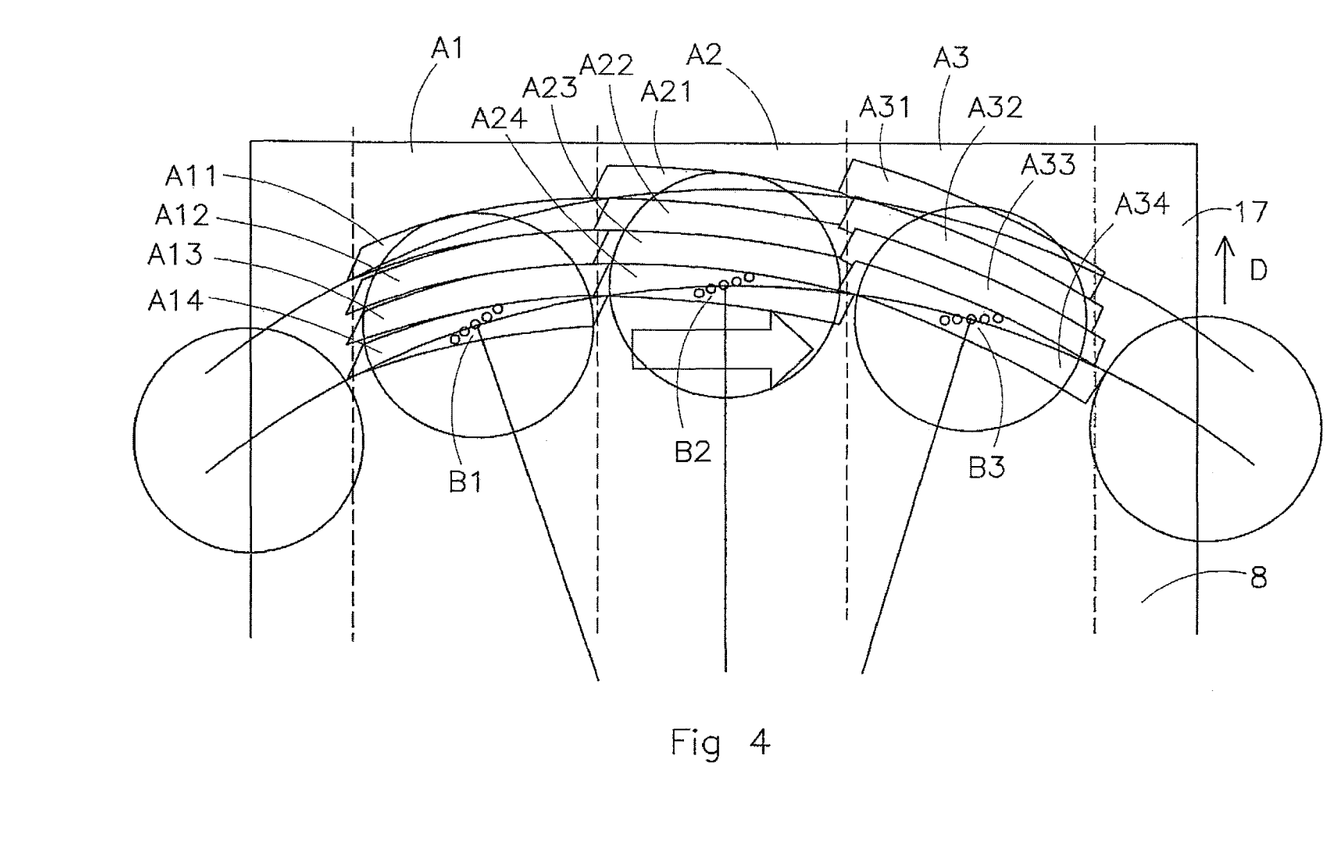
FIG. 4 depicts a schematic top view of projections by the lithographic apparatus according to FIG. 3 onto a substrate according to an embodiment of the invention.

As the rotatable frame rotates, the beams are incident on successive lenses and, each time a lens is irradiated by the beams, the places where the beam is incident on a surface of the lens, moves. Since the beams are projected on the substrate differently (with e.g. a different deflection) depending on the place of incidence of the beams on the lens, the beams (when reaching the substrate) will make a scanning movement with each passage of a following lens. This principle is further explained with reference to FIG. 4. FIG. 4 depicts a highly schematic top view of a part of the rotatable frame 8. A first set of beams is denoted by B1, a second set of beams is denoted by B2 and a third set of beams is denoted by B3. Each set of beams is projected through a respective lens set 14, 18 of the rotatable frame 8. As the rotatable frame 8 rotates, the beams B1 are projected onto the substrate 17 in a scanning movement, thereby scanning area A14. Similarly, beams B2 scan area A24 and beams B3 scan area A34. At the same time of the rotation of the rotatable frame 8 by a corresponding actuator, the substrate 17 and substrate table are moved in the direction D, which may be along the X axis as depicted in FIG. 2), thereby being substantially perpendicular to the scanning direction of the beams in the area's A14, A24, A34. As a result of the movement in direction D by a second actuator (e.g. a movement of the substrate table by a corresponding substrate table motor), successive scans of the beams when being projected by successive lenses of the rotatable frame 8, are projected so as to substantially abut each other, resulting in substantially abutting areas A11, A12, A13, A14 (areas A11, A12, A13 being previously scanned and A14 being currently scanned as shown in FIG. 4) for each successive scan of beam B1, resulting in substantially abutting areas areas A21, A22, A23 and A24 (areas A21, A22, A23 being previously scanned and A24 being currently scanned as shown in FIG. 4) for each successive scan of beam B2, and resulting in substantially abutting areas areas A31, A32, A33 and A34 (areas A31, A32, A33 being previously scanned and A34 being currently scanned as shown in FIG. 4) for each successive scan of beam B3. Thereby, the areas A1, A2 and A3 of the substrate surface may be covered with a movement of the substrate in the direction D while rotating the rotatable frame 8. The projecting of multiple beams through a same lens allows processing of a whole substrate in a shorter timeframe (at a same rotating speed of the rotatable frame 8), since for each passing of a lens, a plurality of beams scan the substrate with each lens, thereby allowing increased displacement in the direction D for successive scans. Viewed differently, for a given processing time, the rotating speed of the rotatable frame may be reduced when multiple beams are projected onto the substrate via a same lens, thereby possibly reducing effects such as deformation of the rotatable frame, wear, vibrations, turbulence, etc. due to high rotating speed. In an embodiment, the plurality of beams are arranged at an angle to the tangent of the rotation of the lenses 14, 18 as shown in FIG. 4. In an embodiment, the plurality of beams are arranged such that each beam overlaps or abuts a scanning path of an adjacent beam.

A further effect of the aspect that multiple beams are projected at a time by the same lens, may be found in relaxation of tolerances. Due to tolerances of the lenses (positioning, optical projection, etc), positions of successive areas A11, A12, A13, A14 (and/or of areas A21, A22, A23 and A24 and/or of areas A31, A32, A33 and A34) may show some degree of positioning inaccuracy in respect of each other. Therefore, some degree of overlap between successive areas A11, A12, A13, A14 may be required. In case of for example 10% of one beam as overlap, a processing speed would thereby be reduced by a same factor of 10% in case of a single beam at a time through a same lens. In a situation where there are 5 or more beams projected through a same lens at a time, the same overlap of 10% (similarly referring to one beam example above) would be provided for every 5 or more projected lines, hence reducing a total overlap by a factor of approximately 5 or more to 2% or less, thereby having a significantly lower effect on overall processing speed. Similarly, projecting at least 10 beams may reduce a total overlap by approximately a factor of 10. Thus, effects of tolerances on processing time of a substrate may be reduced by the feature that multiple beams are projected at a time by the same lens. In addition or alternatively, more overlap (hence a larger tolerance band) may be allowed, as the effects thereof on processing are low given that multiple beams are projected at a time by the same lens.

Alternatively or in addition to projecting multiple beams via a same lens at a time, interlacing techniques could be used, which however may require a comparably more stringent matching between the lenses. Thus, the at least two beams projected onto the substrate at a time via the same one of the lenses have a mutual spacing, and the lithographic apparatus may be arranged to operate the second actuator so as to move the substrate with respect to the optical column to have a following projection of the beam to be projected in the spacing.

In order to reduce a distance between successive beams in a group in the direction D (thereby e.g. achieving a higher resolution in the direction D), the beams may be arranged diagonally in respect of each other, in respect of the direction D. The spacing may be further reduced by providing a segmented mirror 30 in the optical path, each segment to reflect a respective one of the beams, the segments being arranged so as to reduce a spacing between the beams as reflected by the mirrors in respect of a spacing between the beams as incident on the mirrors. Such effect may also be achieved by a plurality of optical fibers, each of the beams being incident on a respective one of the fibers, the fibers being arranged so as to reduce along an optical path a spacing between the beams downstream of the optical fibers in respect of a spacing between the beams upstream of the optical fibers.

Further, such effect may be achieved using an integrated optical waveguide circuit having a plurality of inputs, each for receiving a respective one of the beams. The integrated optical waveguide circuit is arranged so as to reduce along an optical path a spacing between the beams downstream of the integrated optical waveguide circuit in respect of a spacing between the beams upstream of the integrated optical waveguide circuit.

A system may be provided to control the focus of an image projected onto a substrate. The arrangement may be provided to adjust the focus of the image projected by part or all of an optical column in an arrangement as discussed above.

In an embodiment the projection system projects the at least one radiation beam onto a substrate formed from a layer of material above the substrate 17 on which a device is to be formed so as to cause local deposition of droplets of the material (e.g. metal) from the layer by a laser induced material transfer.

Figure 10:
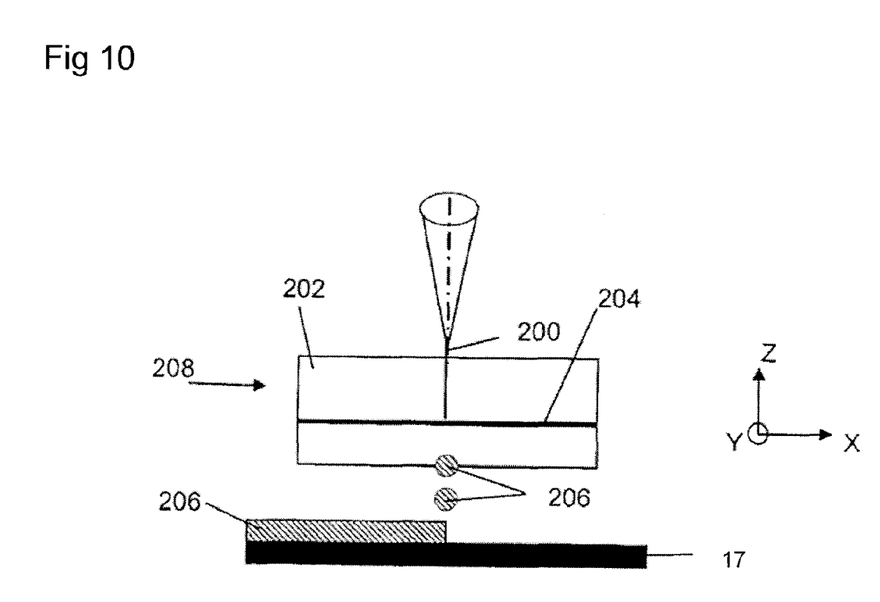
FIG. 10 depicts in cross-section, a part of an embodiment of the invention.

Referring to FIG. 10, the physical mechanism of laser induced material transfer is depicted. In an embodiment, a radiation beam 200 is focused through a substantially transparent material 202 (e.g., glass) at an intensity below the plasma breakdown of the material 202. Surface heat absorption occurs on a substrate formed from a donor material layer 204 (e.g., a metal film) overlying the material 202. The heat absorption causes melting of the donor material 204. Further, the heating causes an induced pressure gradient in a forward direction leading to forward acceleration of a donor material droplet 206 from the donor material layer 204 and thus from the donor structure (e.g., plate) 208. Thus, the donor material droplet 206 is released from the donor material layer 204 and is moved (with or without the aid of gravity) toward and onto the substrate 17 on which a device is to be formed. By pointing the beam 200 on the appropriate position on the donor plate 208, a donor material pattern can be deposited on the substrate 17. In an embodiment, the beam is focused on the donor material layer 204.

In an embodiment, one or more short pulses are used to cause the transfer of the donor material. In an embodiment, the pulses may be a few picoseconds or femto-seconds long to obtain quasi one dimensional forward heat and mass transfer of molten material. Such short pulses facilitate little to no lateral heat flow in the material layer 204 and thus little or no thermal load on the donor structure 208. The short pulses enable rapid melting and forward acceleration of the material (e.g., vaporized material, such as metal, would lose its forward directionality leading to a splattering deposition). The short pulses enable heating of the material to just above the heating temperature but below the vaporization temperature. For example, for aluminum, a temperature of about 900 to 1000 degrees Celsius is desirable.

In an embodiment, through the use of a laser pulse, an amount of material (e.g., metal) is transferred from the donor structure 208 to the substrate 17 in the form of 100-1000 nm droplets. In an embodiment, the donor material comprises or consists essentially of a metal. In an embodiment, the metal is aluminum. In an embodiment, the material layer 204 is in the form a film. In an embodiment, the film is attached to another body or layer. As discussed above, the body or layer may be a glass.

Figure 5:
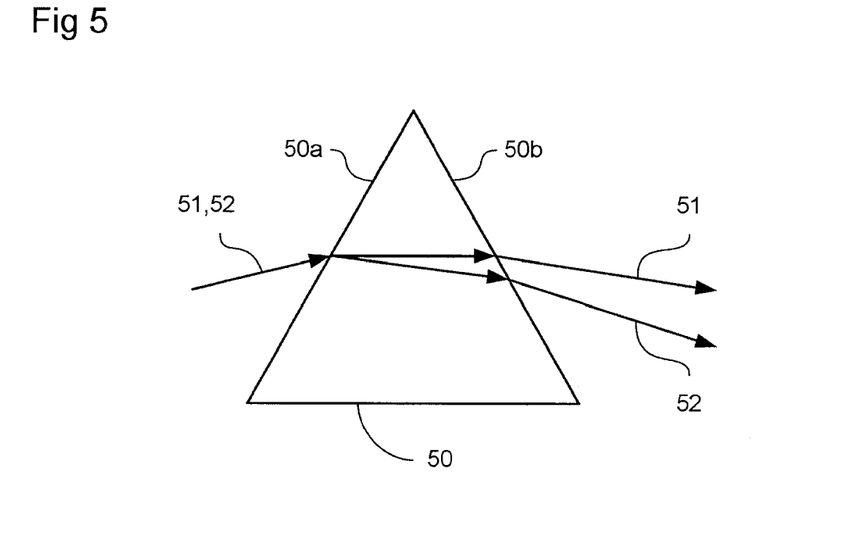
FIG. 5 depicts a prism in cross-section, showing dispersion of radiation of different wavelengths.

A difficulty caused by a small variation of the wavelength of the plurality of radiation beams identified above may be further explained by reference to FIG. 5. FIG. 5 depicts, in cross-section, a prism 50 onto which two coincident radiation beams 51, 52 are incident on an input face 50*a*. The two radiation beams 51, 52 have slightly different wavelengths. Consequently, as the radiation beams 51, 52 pass through the prism, the paths diverge. Consequently, the two beams of radiation 51, 52 are output from slightly different locations on the output face 50*b* of the prism and one is at a small angle relative to the other.

This effect, which is known as dispersion, is caused by the refractive index of the material of the prism varying with the wavelength of the radiation passing through the prism 50. Similar effects occur as the plurality of beams of radiation in a lithographic apparatus pass through the optical elements of the projection system, resulting in a deviation of the position and angle of one or more of the plurality of radiation beams. Such deviation depends upon the variation of the wavelength of the radiation beam from a nominal wavelength. Such an error may be reduced or minimized, for example, by reducing or minimizing the wavelength variation of one or more of the radiation beams. In the case of using a plurality of self-emissive contrast devices, this may be achieved by selecting only self-emissive contrast devices within a narrow wavelength range. However, this could result in significant increases in manufacturing costs. An additional or alternative solution is to adjust the radiation beam pointing of each of the self-emissive contrast devices in order to compensate for deviation caused as the radiation beam passes through the projection system. However, this may be relatively expensive.

However, in addition to or instead of attempting to reduce or minimize the effects of dispersion or compensate for the effects of dispersion, one may take advantage of the effects of dispersion.

An additional problem for lithographic apparatus such as that discussed above, in which a plurality of beams of radiation are projected onto a substrate, is that it is desirable for each of the beams of radiation to be brought as close together as possible in order to enable the formation of a pattern with relatively small pattern features. At the same time, there is a practical limitation on how close one may bring together elements of a patterning device used to control each radiation beam. For example, in the case of using self-emissive contrast devices, the devices must be of a finite size, resulting in a minimum separation of the radiation beams at the point of generation. The plurality of radiation beams may be brought closer together by using demagnifying optics. However, the greater the demagnification, the more sensitive the system becomes to radiation beam pointing errors. Therefore, large demagnification is undesirable.

Figure 6:
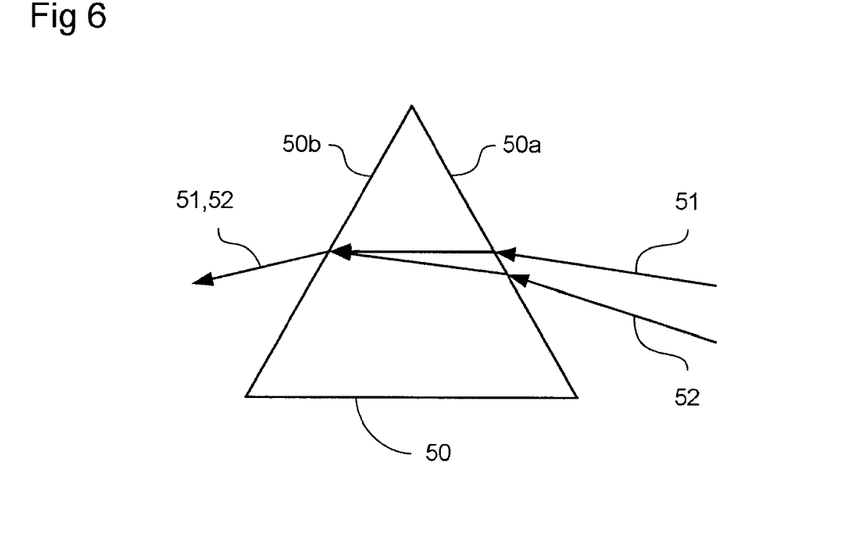
FIG. 6 depicts, in cross-section, a part of an embodiment of the invention.

FIG. 6 depicts, in cross-section, how dispersion may be used to bring together radiation beams that have a small difference in wavelength. Effectively, the system is the same as that depicted in FIG. 5 but reversed. Accordingly, the two radiation beams 51, 52 having slightly different radiation wavelengths are directed onto an input face 50*a* of a prism 50 at slightly set apart locations and with one at a small angle relative to the other. By appropriate selection of the location at which the radiation beams 51, 52 are incident on the prism 50 and selection of the angle between them, the radiation beams 51, 52 may be arranged to be output parallel to each other and, if desired, coincident with each other.

In an embodiment of the lithographic apparatus, the above explained principle may be used in order to bring closer together the beams of radiation that are to be projected onto the substrate. In particular, the radiation beams may be divided into two or more groups. Each group may include one or more radiation beams having a wavelength within a relatively narrow range. The one or more radiation beams in each group may be directed onto a dispersion element such that there is an angular separation between the radiation beams of each of the groups at the input but such that the radiation beams that are output from the dispersion element are substantially parallel.

Figure 7:
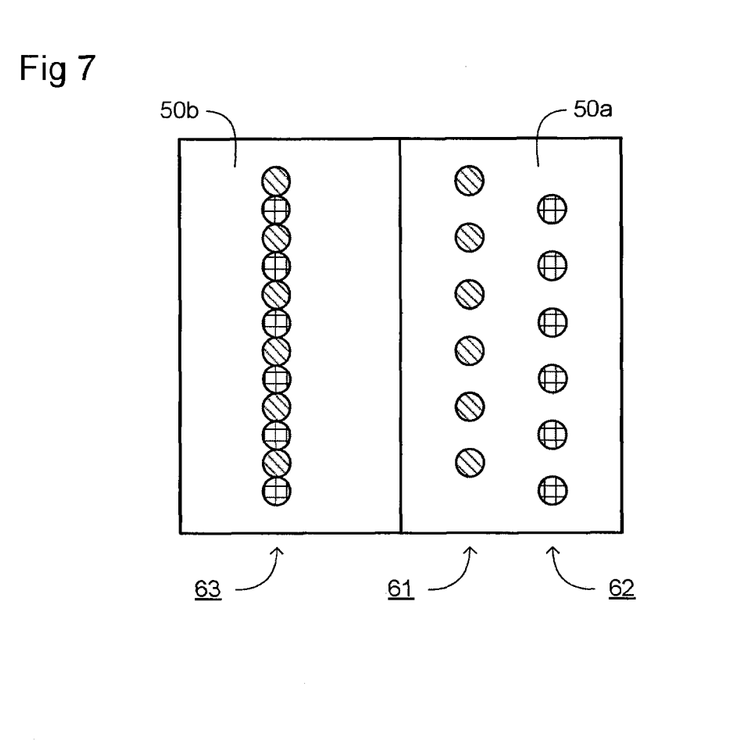
FIG. 7 depicts, in plan view, part of an embodiment of the invention.

In an embodiment, a prism 50, such as that depicted in FIGS. 5 and 6 discussed above, may be used as the dispersion element. FIG. 7 depicts in plan view the arrangement of the groups of radiation beams. As shown, the radiation beams may be projected onto the input face 50*a* of the prism 50. As shown, one or more radiation beams may be provided into a first group 61 having a radiation with a wavelength within a first range and a second group 62 having radiation with a wavelength in a second range. The wavelength ranges may be different. In an embodiment, the wavelength ranges may not overlap.

As shown in FIG. 7, each of the groups 61, 62 are arranged as an evenly-spaced row of parallel radiation beams. Consequently, when the two groups are combined together to form the output group of radiation beams 63, the radiation beams from the original groups 61, 62 are regularly interleaved. However, in other arrangements, a different spacing of the radiation beams may be used.

In either case, due to the passage of the radiation beams of the groups 61, 62 through the prism 50, the radiation beams output from the output face 50*b* are provided in a single output row 63 of radiation beams. Furthermore, in the same manner as is depicted in FIG. 6, whereas the input radiation beams are arranged such that there is a small difference in the angle of incidence between the first and second group 61, 62, all of the output beams of radiation 63 are substantially parallel.

Accordingly, as shown in FIG. 7, the two groups 61, 62 of radiation beams input to the prism 50 may have a first pitch, namely the separation between adjacent beams of radiation, but the pitch of the output beams of radiation, once the groups have been combined, may be smaller.

For example, the input beams of radiation may have a 0.5 mm diameter and a pitch of 1 mm when incident on the input face 50*a* of the prism 50. In that case, the groups of output beams of radiation 63 may have substantially the same spot size on the output face 50*b* but may have a pitch reduced by half, for example 0.5 mm.

Figure 8:
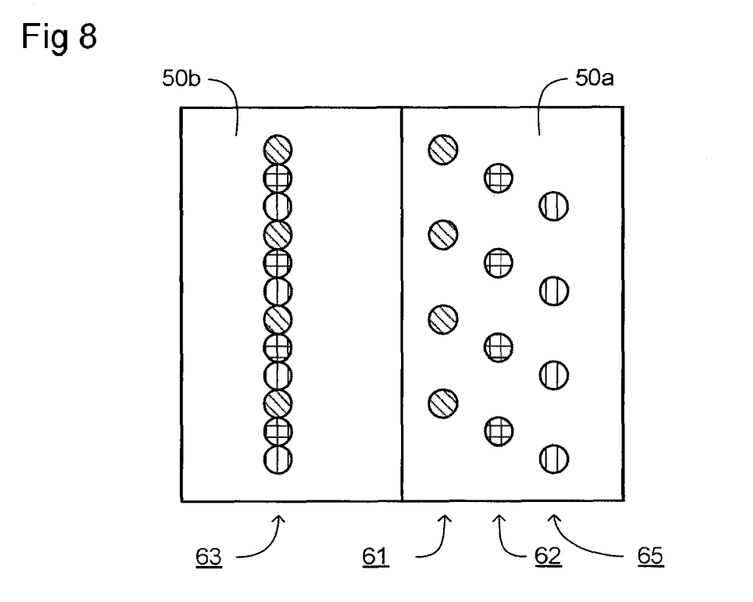
FIG. 8 depicts, in plan view, part of an embodiment of the invention.

FIG. 8 depicts, in plan view, a variation of the embodiment depicted in FIG. 7. As shown, in this case, three groups 61, 62, 65 of radiation beams are input to the prism 50 and combined to form a single group of output beams of radiation 63, arranged in a single row and arranged to be substantially parallel to each other. In such an embodiment, each of the groups 61, 62, 65 are formed from radiation in different wavelength ranges, which may each be distinct and separate. Furthermore, the input radiation beams are arranged such that, within each group 61, 62, 65, the radiation beams are substantially parallel and arranged in a row, but each of the groups 61, 62, 65 of radiation beams are input to the prism 50 at an angle relative to the others. As is depicted in FIG. 8, by means of such an arrangement, the pitch of the groups of radiation beams may be reduced from the initially provided groups to the output group by a factor of 3.

Depending on the requirements of the system, any number of groups of radiation beams may be used in order to provide a desired factor of reduction of the pitch of the radiation beams.

In an embodiment utilizing two groups of radiation beams, the nominal wavelength of the radiation of the two groups of radiation beams may be 400 and 410 nm. In an embodiment utilizing three groups of radiation beams, the nominal wavelengths of the groups of radiation beams may be 400, 405 and 410 nm. In either case, in an embodiment, the size of the wavelength range for each group may be 1 nm or less, optionally centered on the nominal wavelength for that group. In an embodiment, the size of the wavelength range may be 10% or less of the difference in wavelength between the nominal wavelength of a group and the nearest other group, optionally centered on the nominal wavelength for that group.

In an embodiment, the prism 50 may be formed from fused silicon. This material may beneficially have properties of relatively high dispersion and an adequate life under the operating conditions in the lithographic apparatus. For fused silicon, the refractive index for radiation of wavelength of 400 nm is 1.4746; the refracted index for radiation with a wavelength of 410 nm is 1.4693. For an arrangement as depicted in FIG. 6 using a fused silicon prism, in order for the output beams of radiation 51, 52 to be substantially parallel, the input beams of radiation 51, 52, having wavelengths of 410 nm and 400 nm, respectively, must have an angular separation of 0.098056°. This angular separation may be enough to provide a desired separation between the sources of the two beams of radiation 51, 52. For example, to provide a separation of 250 μm, with this angular separation the sources would need to be at a distance of approximately 146 mm from the prism 50.

Alternative arrangements of a prism may be used. Furthermore, different materials may be used to form the prism 50. The material may be selected, for example, to provide an adequate difference in the refractive index for the radiation wavelengths being used and to provide an adequate lifetime of the component in use in a lithographic apparatus. In place of fused silicon, a so-called flint glass may be selected that has a relatively high dispersion value. Examples of such materials include those designated F2 and N-SF11, manufactured by Schott.

Although an embodiment of the invention has been described above by reference to the use of a prism 50 to form the dispersion element, other configurations may be used, utilizing other elements that provide a varying response that depends upon the wavelength of the radiation used.

Figure 9:
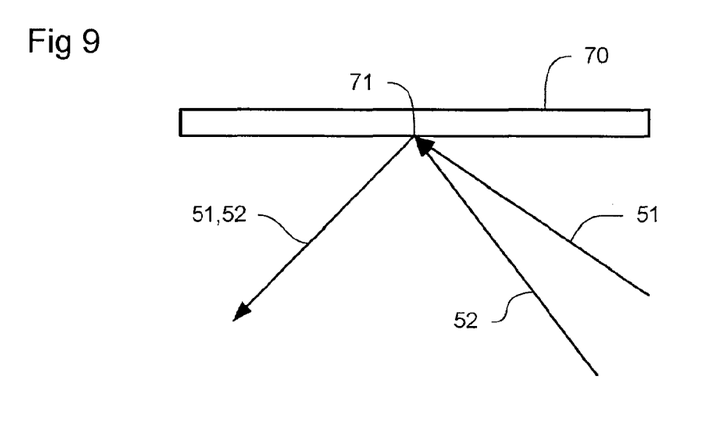
FIG. 9 depicts, in cross-section, a part of an embodiment of the invention.

In an embodiment, depicted in FIG. 9, the dispersion element may be formed from a grating 70. In the case of a grating 70, the angle of reflection of a particular order of radiation other than the zero order radiation is dependent upon the wavelength of the radiation. Accordingly, as depicted in FIG. 9, the two input beams of radiation 51, 52, having different wavelengths, may be configured to be incident on a grating 70 such that a selected order of radiation of both is reflected at the substantially same angle relative to the surface of the grating 70. By means of such an arrangement, the output beams of radiation 51, 52 are substantially coincident.

In comparing FIGS. 6 and 9, a difference between the use of a prism 50 and a grating 70 is that, in respect of using the grating 70, the input beams of radiation 51, 52 are incident at a substantially same point 71 on the grating 70. In other respects, the arrangement of the dispersion element in the lithographic apparatus may be similar.

As is explained above, in a lithographic apparatus according to an embodiment of the present invention, the plurality of beams of radiation are divided into separate groups, each associated with a particular range of radiation wavelengths.

The different response of a dispersion element to the different wavelengths is used in order to bring these plurality of beams of radiation closer together. However, the one or more beams of radiation associated with each group may also respond differently from each other when passing through one or more other optical elements within the projection system. Accordingly, in an embodiment, the projection system may include at least one chromatic correction element that is configured to at least partially compensate for a difference in the response of the one or more optical elements of the projection system other than the dispersion element due to the difference in wavelength between the groups of radiation beams.

For example, in the absence of chromatic correction, there may be a focus error between the radiation beams of each group. The chromatic correction element may therefore be a section of material, appropriately selected to have a variation in the refractive index for each of the radiation wavelengths used, in order to compensate for this error.

Alternatively or additionally, such a focus error, caused by variation between the radiation wavelength of the groups, may be reduced or minimized by adjusting the optical path length between the radiation source(s) of each group and the dispersion element.

The dispersion element and chromatic correction element, where used, may be arranged in any of a number of different locations within the lithographic apparatus. In an embodiment having a projection system with at least a stationary part and a moving part, the stationary part may comprise the dispersion element. In an embodiment, the dispersion element may be arranged to be the first optical element within the projection system, or one of the first few elements within the projection system. By arranging the dispersion element in this way. The construction of the subsequent one or more optical elements within the projection system may benefit from the separation between the plurality of radiation beams having been reduced.

Although an embodiment of the invention has been described above with reference to a dispersion element as part of the projection system, this is merely an exemplary arrangement and the dispersion element may be provided at one or more other locations within the lithographic apparatus. In an embodiment, the dispersion element may be provided between a plurality of radiation sources, configured to provide a plurality of radiation beams, and the one or more patterning devices configured to impart a pattern to the plurality of radiation beams.

In an embodiment, the chromatic correction element, where used, may be the final optical element within the projection system or one of the final elements.

In accordance with a device manufacturing method, a device, such as a display, integrated circuit or any other item may be manufactured from the substrate on which the pattern has been projected.

In an embodiment, there is provided a lithographic apparatus, comprising: a projection system configured to project a plurality of radiation beams onto a substrate, wherein the plurality of radiation beams comprises a first group of one or more radiation beams formed from radiation within a first wavelength range and a second group of one or more radiation beams formed from radiation within a second wavelength range, different from the first wavelength range; and a dispersion element, configured such that one or more radiation beams of the first group are incident on the dispersion element at a different angle from the one or more radiation beams of the second group and such that the one or more radiation beams of the first and second group output from the dispersion element are substantially parallel.

In an embodiment, the dispersion element comprises a prism formed from a material that has a refractive index that varies with the wavelength of radiation passing through it. In an embodiment, the prism is formed from fused silicon. In an embodiment, the dispersion element comprises a grating. In an embodiment, the plurality of radiation beams comprises a third group of one or more radiation beams formed from radiation within a third wavelength range, different from the wavelength ranges of the other groups; and the dispersion element is configured such that one or more radiation beams of each of the groups are incident on the dispersion element at different angles from the other groups and such that the radiation beams of each of the groups output from the dispersion element are substantially parallel. In an embodiment, the radiation beams within each group are arranged in a respective row associated with each group when incident on the dispersion element, and the radiation beams of all of the groups are arranged in a single row when output from the dispersion element. In an embodiment, the radiation beams from each of the groups are arranged in the output row of radiation beams in a regularly interleaved manner. In an embodiment, the wavelength range of each of the groups is 1 nm or less. In an embodiment, the wavelength range of each of the groups is 10% or less of the wavelength separation from the nearest wavelength range of another group. In an embodiment, no two of the wavelength ranges associated with the groups of radiation beams overlap. In an embodiment, the radiation beam path length between a programmable patterning device configured to provide the plurality of radiation beams and the dispersion element is arranged to be different for each of the groups of radiation beams, the difference being selected to reduce a difference in a position of best focus of the radiation beams when projected onto the substrate that is introduced by differences in the response of the projection system to the different radiation wavelengths. In an embodiment, the projection system comprises a chromatic correction element arranged between the dispersion element and the substrate, the chromatic correction element configured to reduce a difference in a position of best focus of the radiation beams when projected onto the substrate that is introduced by differences in the response of other elements of the projection system to the different radiation wavelengths. In an embodiment, the lithographic apparatus further comprises a or the programmable patterning device, configured to provide the plurality of radiation beams. In an embodiment, the programmable patterning device comprises a controllable element to selectively provide the plurality of radiation beams. In an embodiment, the programmable patterning device comprises a plurality of self-emissive contrast devices. In an embodiment, the projection system comprises a stationary part and a moving part. In an embodiment, the moving part is configured to rotate relative to the stationary part. In an embodiment, the stationary part comprises the dispersion element.

In an embodiment, there is provided a device manufacturing method comprising: using a projection system to project a plurality of radiation beams onto a substrate, wherein the plurality of radiation beams comprises a first group of one or more radiation beams formed from radiation within a first wavelength range and a second group of one or more radiation beams formed from radiation within a second wavelength range, different from the first wavelength range; and passing the radiation beams via a dispersion element such that the one or more radiation beams of the first group are incident on the dispersion element at a different angle from the one or more radiation beams of the second group and such that the radiation beams of the first and second group output from the dispersion element are substantially parallel.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one of various types of optical components, including refractive, diffractive, reflective, magnetic, electromagnetic and electrostatic optical components or combinations thereof.

The descriptions above are intended to be illustrative, not limiting. Thus, it will be apparent to one skilled in the art that modifications may be made to the invention as described without departing from the scope of the claims set out below.

The invention claimed is:

1. An exposure apparatus, comprising:
a projection system configured to project a plurality of radiation beams onto a substrate, wherein the plurality of radiation beams comprises a first group of radiation beams formed from radiation within a first wavelength range and a second group of radiation beams formed from radiation within a second wavelength range, different from the first wavelength range; and
a dispersion element, configured such that radiation beams of the first group are incident on the dispersion element at a different angle from radiation beams of the second group and such that the radiation beams of the first and second groups output from the dispersion element are substantially parallel, wherein the radiation beams within each group incident on the dispersion element are arranged in a respective row associated with each group when incident on the dispersion element, and the radiation beams of the first and second groups output from the dispersion element are arranged in a single row when output from the dispersion element.

2. The apparatus according to claim 1, wherein the dispersion element comprises a prism formed from a material that has a refractive index that varies with the wavelength of radiation passing through it.

3. The apparatus according to claim 2, wherein the prism is formed from fused silicon.

4. The apparatus according to claim 1, wherein the dispersion element comprises a grating.

5. The apparatus according to claim 1, wherein:
the plurality of radiation beams comprises a third group of one or more radiation beams formed from radiation within a third wavelength range, different from the wavelength ranges of the other groups; and
the dispersion element is configured such that one or more radiation beams of each of the groups are incident on the dispersion element at different angles from the other groups and such that the radiation beams of each of the groups output from the dispersion element are substantially parallel.

6. The apparatus according to claim 1, wherein the radiation beams from each of the groups are arranged in the output row of radiation beams in a regularly interleaved manner.

7. The apparatus according to claim 1, wherein the wavelength range of each of the groups is 1 nm or less.

8. The apparatus according to claim 1, wherein the wavelength range of each of the groups is 10% or less of the wavelength separation from the nearest wavelength range of another group.

9. The apparatus according to claim 1, wherein no two of the wavelength ranges associated with the groups of radiation beams overlap.

10. The apparatus according to claim 1, wherein the radiation beam path length between a programmable patterning device configured to provide the plurality of radiation beams and the dispersion element is arranged to be different for each of the groups of radiation beams, the difference being selected to reduce a difference in a position of best focus of the radiation beams when projected onto the substrate that is introduced by differences in the response of the projection system to the different radiation wavelengths.

11. The apparatus according to claim 1, wherein the projection system comprises a chromatic correction element arranged between the dispersion element and the substrate, the chromatic correction, element configured to reduce a difference in a position of best focus of the radiation beams when projected onto the substrate that is introduced by differences in the response of other elements of the projection system to the different radiation wavelengths.

12. The apparatus according to claim 1, further comprising a programmable patterning device, configured to provide the plurality of radiation beams.

13. The apparatus according to claim 12, wherein the programmable patterning device comprises a controllable element to selectively provide the plurality of radiation beams.

14. The apparatus according to claim 12, wherein the programmable patterning device comprises a plurality of self-emissive contrast devices.

15. The apparatus according to claim 1, wherein the projection system comprises a stationary part and a moving part.

16. The apparatus according to claim 15, wherein the moving part is configured to rotate relative to the stationary part.

17. The apparatus according to claim 15, wherein the stationary part comprises the dispersion element.

18. A device manufacturing method comprising:
using a projection system to project a plurality of radiation beams onto a substrate, wherein the plurality of radiation beams comprises a first group of radiation beams formed from radiation within a first wavelength range and a second group of radiation beams formed from radiation within a second wavelength range, different from the first wavelength range; and
passing the radiation beams via a dispersion element such that radiation beams of the first group are incident on the dispersion element at a different angle from radiation beams of the second group and such that the radiation beams of the first and second groups output from the dispersion element are substantially parallel, wherein the radiation beams within each group incident on the dispersion element are arranged in a respective row associated with each group when incident on the dispersion element, and the radiation beams of the first and second groups output from the dispersion element are arranged in a single row when output from the dispersion element.

19. An exposure apparatus, comprising:

a projection system configured to project a plurality of radiation beams onto a substrate, wherein the plurality of radiation beams comprises a first group of radiation beams formed from radiation within a first wavelength range and a second group of one or more radiation beams formed from radiation within a second wavelength range, different from the first wavelength range; and a dispersion element, configured such that radiation beams of the first group are incident on the dispersion element at a different angle, from one or more radiation beams of the second group and such that the radiation beams of the first and second groups output from the dispersion element are substantially parallel in a single row and output from the dispersion element at a different angle than the angles of incidence on the dispersion element of the radiation beams of the first group and of the one or more radiation beams of the second group.

20. The apparatus according to claim 19, wherein the one or more radiation beams from the first group is interleaved with the radiation beams from the second group in the output row.

\* \* \* \* \*